United States Patent
Chang et al.

(10) Patent No.: US 11,714,570 B2
(45) Date of Patent: Aug. 1, 2023

(54) COMPUTING-IN-MEMORY DEVICE AND METHOD

(71) Applicant: Taiwan Semiconductor Manufacturing Company, Ltd., Hsinchu (TW)

(72) Inventors: Jonathan Tsung-Yung Chang, Hsinchu (TW); Hidehiro Fujiwara, Hsinchu (TW); Hung-Jen Liao, Hsinchu (TW); Yen-Huei Chen, Hsinchu (TW); Yih Wang, Hsinchu (TW); Haruki Mori, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/130,918

(22) Filed: Dec. 22, 2020

(65) Prior Publication Data
US 2021/0263672 A1 Aug. 26, 2021

Related U.S. Application Data

(60) Provisional application No. 62/981,834, filed on Feb. 26, 2020.

(51) Int. Cl.
*G06F 3/06* (2006.01)
*G11C 11/419* (2006.01)
(Continued)

(52) U.S. Cl.
CPC .......... *G06F 3/0655* (2013.01); *G06F 3/0604* (2013.01); *G06F 3/0673* (2013.01);
(Continued)

(58) Field of Classification Search
CPC ..................................................... G11C 7/10
See application file for complete search history.

(56) References Cited

U.S. PATENT DOCUMENTS 10,304,525 B2 * 5/2019 Mohammadi ............ G11C 8/14
10,825,510 B2 * 11/2020 Jaiswal ................ G11C 11/412
(Continued)

FOREIGN PATENT DOCUMENTS

TW 202001884 A 1/2020
WO 2019051354 A1 3/2019

*Primary Examiner* — Douglas King
(74) *Attorney, Agent, or Firm* — Merchant & Gould P.C.

(57) ABSTRACT

A charge sharing scheme is used to mitigate the variations in cell currents in order to achieve higher accuracy for CIM computing. In some embodiments, a capacitor is associated with each SRAM cell, and the capacitors associated with all SRAM cells in a column are included in averaging the RBL current. In some embodiments, a memory unit associated to an RBL in a CIM device includes a storage element adapted to store a weight, a first switch device connected to the storage element and adapted to be controlled by an input signal and generate a product signal having a magnitude indicative of the product of the input signal and the stored weight. The memory unit further includes a capacitor adapted to receive the product signal and store an amount of charge corresponding to the magnitude of the product signal. The memory unit further include a second switch device adapted to transfer the charge on the capacitor to the RBL.

12 Claims, 13 Drawing Sheets

(51) Int. Cl.
    *G11C 7/10*     (2006.01)
    *G11C 8/16*     (2006.01)
    *G06N 3/063*     (2023.01)

(52) U.S. Cl.
    CPC ............... *G06N 3/063* (2013.01); *G11C 7/10* (2013.01); *G11C 8/16* (2013.01); *G11C 11/419* (2013.01)

(56) References Cited

U.S. PATENT DOCUMENTS

| | | | |
|---|---|---|---|
| 2014/0362636 A1* | 12/2014 | Erickson | G11C 5/005 |
| | | | 365/149 |
| 2019/0042199 A1* | 2/2019 | Sumbul | G11C 11/404 |
| 2019/0043560 A1 | 2/2019 | Sumbul et al. | |
| 2020/0105337 A1* | 4/2020 | Chen | H01L 27/1104 |
| 2021/0158854 A1* | 5/2021 | Sinangil | G11C 11/4094 |
| 2021/0240442 A1* | 8/2021 | Srivastava | G11C 11/54 |
| 2021/0271597 A1* | 9/2021 | Verma | G06F 12/0207 |
| 2021/0349689 A1* | 11/2021 | Lu | G11C 11/54 |

* cited by examiner

COMPUTING-IN-MEMORY DEVICE AND METHOD

CROSS-REFERENCE TO RELATED APPLICATIONS

The present application claims the benefit of U.S. Provisional Patent Application No. 62/981,834 titled "COMPUTING-IN-MEMORY DEVICE AND METHOD" and filed Feb. 26, 2020, the disclosure of which is hereby incorporated by reference in its entirety.

BACKGROUND

This disclosure relates generally to memory arrays used in data processing, such as multiply-accumulate operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
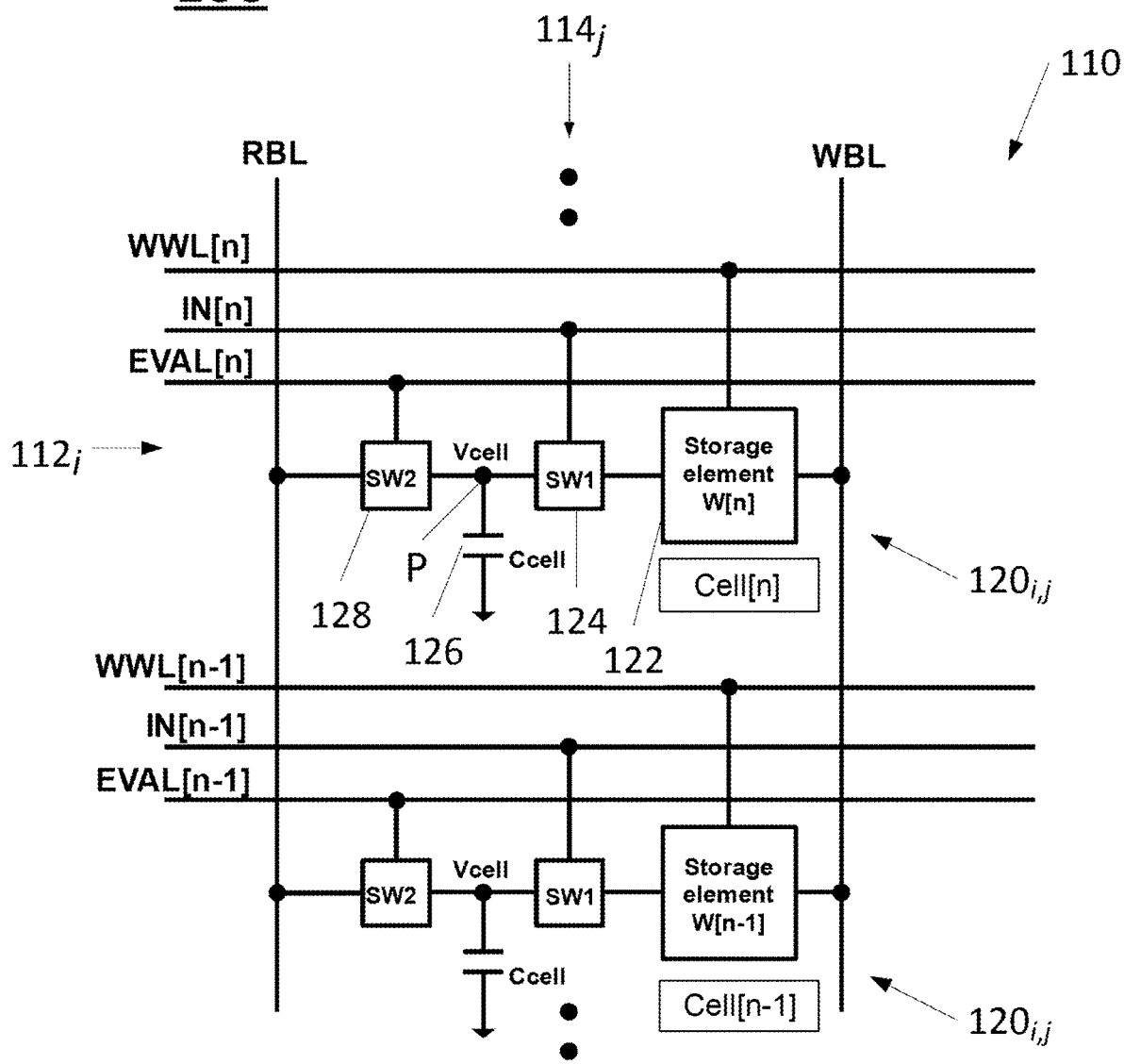
FIG. 1 is a schematic diagram of a portion of a computing-in-memory ("CIM") device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This disclosure relates generally to computing-in-memory ("CIM"). An example of applications of CIM is multiply-accumulate ("MAC") operations, in which an input array of numbers are multiplied (weighted) by the respective elements in another array (e.g., column) of numbers (weights), and the products are added together (accumulated) to produce an output sum. This is mathematically similar to a dot product (or scalar product) of two vectors, in which procedure the components of two vectors are pair-wise multiplied with each other, and the products of the component pairs are summed. In certain artificial intelligence (AI) systems, such as artificial neural networks, an array of numbers can be weighted by multiple columns of weights. The weighting by each column produces a respective output sum. An output array of sums thus is produced from an input array of numbers by the weights in a matrix of multiple columns. Similar operations are employed in other applications, such as multi-bit convolutional neural network ("CNN") operations.

CIM can be implemented with a variety of memory devices, including static random-access memory ("SRAM"). In a typical SRAM device, data are written to, and read from, an SRAM cell via one or more bitlines ("BLs") upon activation of one or more access transistors in the SRAM cell by enable-signals from one or more wordlines ("WLs"). Conventional SRAM based CIM design turns on multiple WLs in a column of SRAM cells to discharge a common BL, such as a read-BL ("RBL") to implement a 1-bit MAC. However, because of cell current variations, the RBL discharge level vary with different cell current combinations, resulting in inaccuracies in MAC operations.

In accordance to some embodiments disclosed in this disclosure, a charge sharing scheme is used to mitigate the variations in cell currents in order to achieve higher accuracy for CIM computing. In some embodiments, a capacitor is associated with each SRAM cell, and the capacitors associated with all SRAM cells in a column are included in averaging the RBL current. In some embodiments, a memory unit associated to an RBL in a CIM device includes a storage element adapted to store a weight, a first switch device connected to the storage element and adapted to be controlled by an input signal and generate a product signal having a magnitude indicative of the product of the input signal and the stored weight. The memory unit further includes a capacitor adapted to receive the product signal and store an amount of charge corresponding to the magnitude of the product signal. The memory unit further include a second switch device adapted to transfer the charge on the capacitor to the RBL.

According to some embodiments, a computing method includes generating a set of product signals, each indicative of a product of a value corresponding to one of a set of input signals with a value stored in a respective one of a set of data storage elements; setting voltages across a set of capacitors, each corresponding to one of the set of data storage elements, to a predetermined level (such as ground); applying the set of product signals to the respective ones of the set of capacitor after the voltages across the capacitor have been set to the predetermined level; discharging the capacitors through an output line after the product signals have been applied to the capacitors; and generating on the output line a signal indicative of a sum of the product signals.

In certain more specific embodiment, as shown in FIGS. 1-5, a compute-in-memory device 100 includes an array 110 of memory units 120 (each cell labeled $120_{i,j}$) arranged in rows 112 (the ith row labeled as $112_i$) and columns 114 (the jth column labeled as $114_j$). The arrangement of the memory units 120 in rows and columns is a logical one but can be a physical one as well. Each memory unit 120 includes a storage element 122, a first switch device 124, a capacitor 126 having a capacitance $C_{cell}$ and a second switch device 128. The CIM device 100 further includes, associated with each row 112 of memory units, a write wordline ("WWL"), an input line ("IN") and an evaluation control line ("EVAL"). The CIM device 100 further includes, associates with each column 114 of memory units, a write bitline ("WBL") and a read bitline ("RBL"). The storage element 122 is connected to the WWL associated with its row and WBL of its column, and is adapted to input the binary signal indicative a weight ("W") (0 or 1) when activated by a signal on the WWL and store the weight. The first switch device 124 is connected to the storage element 112 and to the associated IN. The first switch device 124 is controlled by the signals on the IN, is adapted to receive the weight from the storage element 122. The capacitor 126 is connected between the first switch device 124 and a reference voltage, in this example the ground. The second switch device 128 is connected to, the corresponding EVAL and controlled by the signal on the EVAL. The second switch interconnects the corresponding RBL and the node P where the first switch device 124 and capacitor 126 are connected to each other.

The value the first switch device 124 outputs to node P is determined by the state of the first switch device 124 and the weight W stored in the storage element 122; the state of the first switch device 124, in turn, is determined by the signal on IN. When the signal on IN is a "1," the first switch device 124 passes on to node P the weight stored in the storage element 122; when the signal on IN is a "0," the first switch device 124 outputs to node P a "0" regardless of the weight stored in the memory element 122. Thus, the output of the first switch device 124 is given by the following table:

| IN | W | Output |
|----|---|--------|
| 0  | 0 | 0      |
| 0  | 1 | 0      |
| 1  | 0 | 0      |
| 1  | 1 | 1      |

It is evident from the table that the output is the product of the signal on IN and the weight stored in the memory element 122, i.e., output=IN×W.

Figure 2:
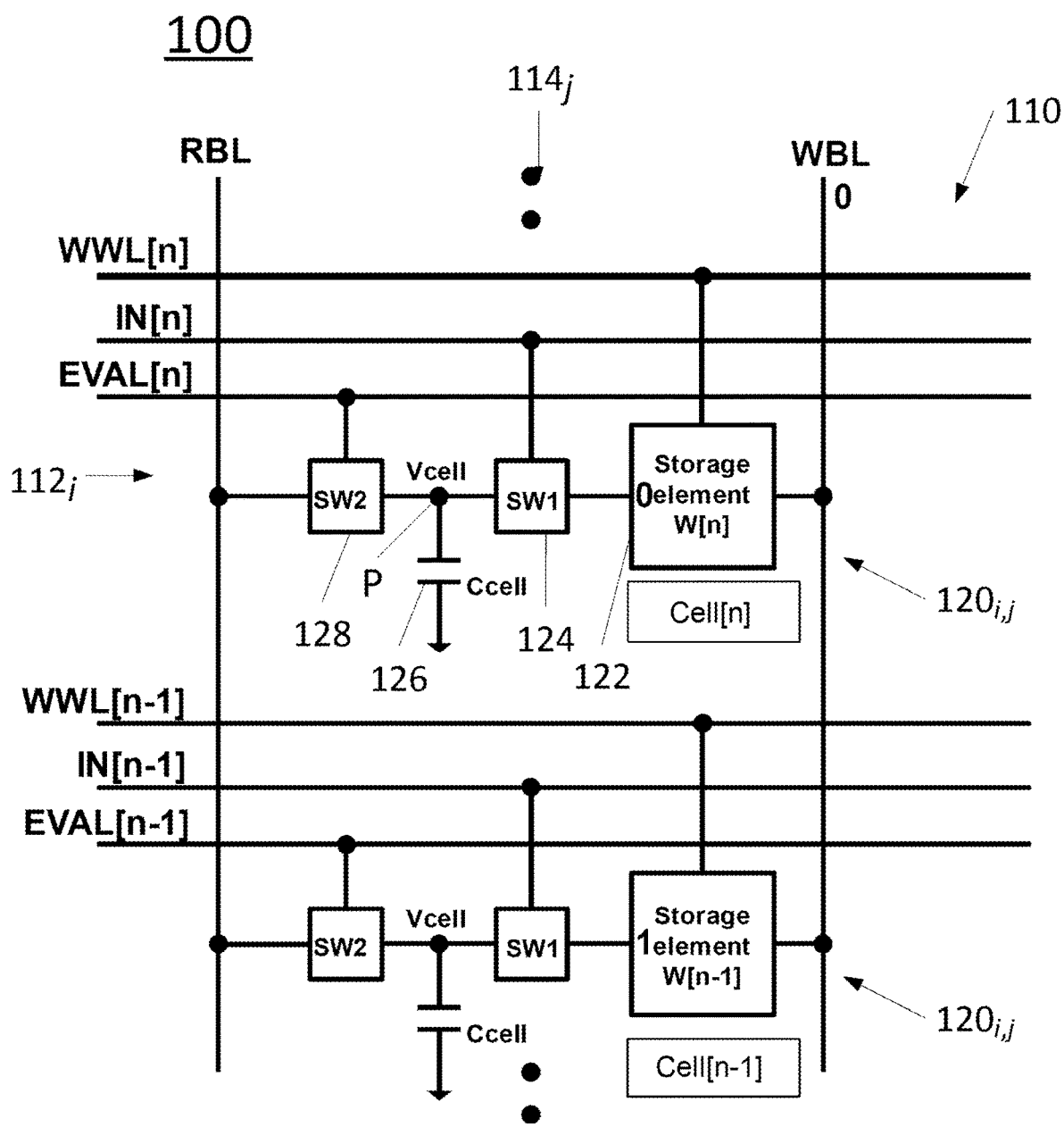
FIG. 2 schematically illustrates writing weights to the CIM device in FIG. 1 in accordance with some embodiments.

In operation, in some embodiments, in the first step, as shown in FIG. 2, weights are written into the storage elements 122 in a column 114 by turning on the respective WWLs one-by-one and setting the value on the WBL depending on the WWL that is turned on. For example, WBL can be set to "0" when WWL for the nth row is on to write a "0" to the storage element in the nth row; WBL can be set to "1" when WWL for the (n−1)st row is on to write a "0" to the storage element in the (n−1)st row.

Figure 3:
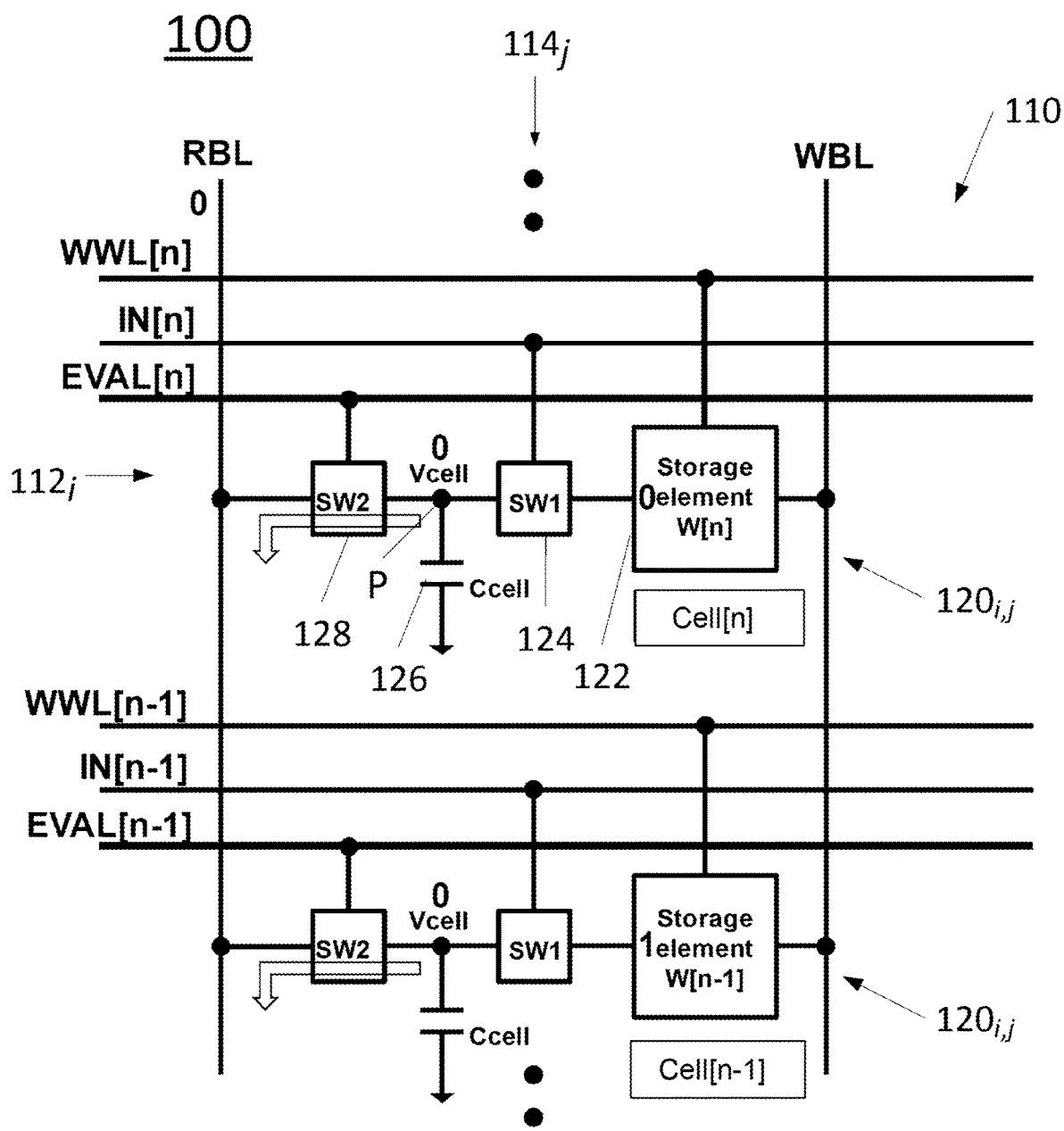
FIG. 3 schematically illustrates resetting cell capacitor voltage of the CIM device in FIG. 1 in accordance with some embodiments.

Next, as shown in FIG. 3, the voltage, Vcell, at the node P for each memory unit 120 is reset by pre-discharging capacitors 126. This can be done in some embodiments by turning off the first switch device 124 (by turning off IN) and turning on the second switch device 128 (by turning on EVAL) in each memory unit 120, and driving the RBL to 0.

Figure 4:
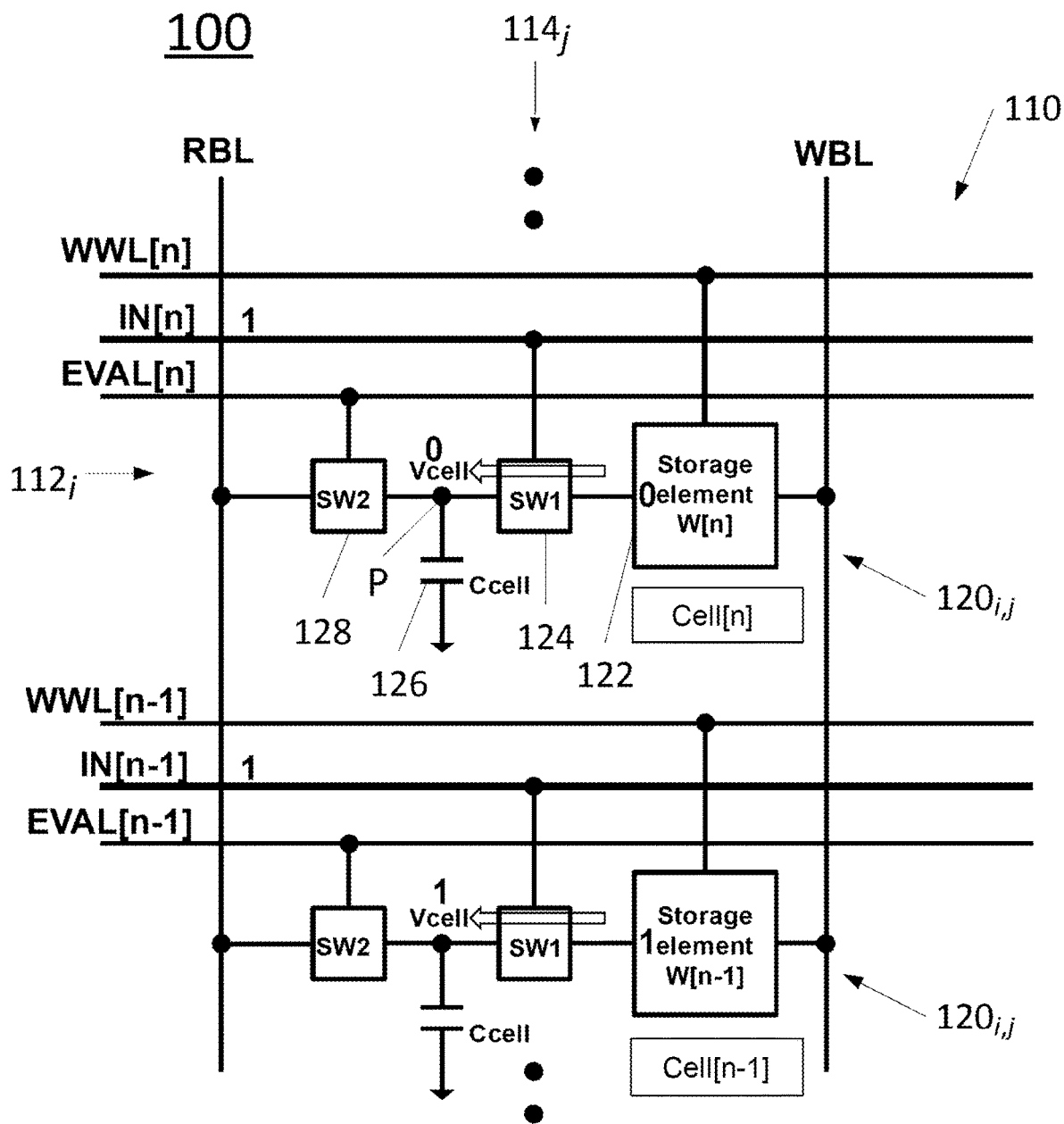
FIG. 4 schematically illustrates performing multiplication of input with the weights stored in the CIM device in FIG. 1 in accordance with some embodiments.
Figure 5:
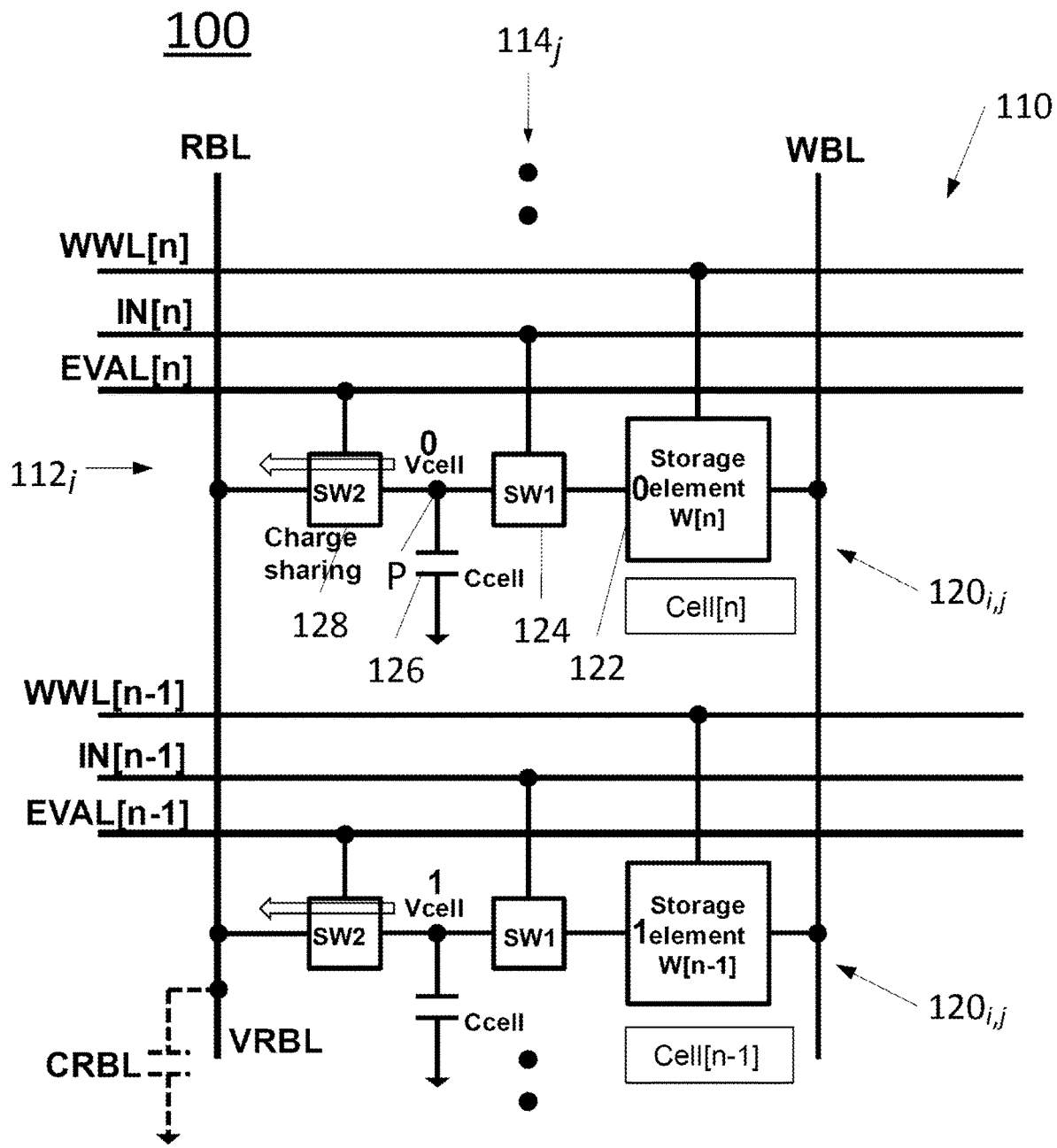
FIG. 5 schematically illustrates summing of the products of the input and the weights stored the CIM device in FIG. 1 in accordance with some embodiments.

Next, as shown in FIG. 4, a multiplication operation IN×W described above is performed by setting INs to appropriate values with the second switch device 128 in each memory unit turned off (EVAL=0). The voltage, $V_{cell}$, at the node P for each memory unit 120 is thus indicative of (e.g., proportional to) the product, IN×W for the memory unit 120. In the example shown in FIG. 4, the weight values stored in storage elements 122 are 0 for the nth row and 1 for (n−1)th row; both inputs are 1, i.e., IN[n]=1, and IN[n−1]=1. With the second switch 128 turned off and first switches 124 turned on, Next, as shown in FIG. 5, a voltage, $V_{RBL}$, that is proportional to the sum of IN×W of all memory units 120 in the column 114 is obtained on the RBL. This is performed by pre-discharging RBL to 0 volts and then turning on all second switching devices 128 (by turning on the EVALs, i.e., EVAL=1), allowing the capacitors 126 to discharge in to the RBL. The RBL has its own capacitance, $C_{RBL}$. The voltage, $V_{RBL}$, on the RBL will thus rise and the capacitors 126 of the memory units 120 are discharged. Because the capacitor 126 are in parallel with each other and with the virtual capacitor of capacitance $C_{RBL}$, the charge on the capacitors 126 in the memory units with W=1 is now shared among all capacitors. The final $V_{RBL}$ is thus given by $$V_{RBL} = \frac{m \times C_{cell} \times V_{DD}}{C_{RBL} + n \times C_{cell}} \quad (1)$$

where n is the number of memory units 120 on the same RBL, m is the number of nodes P that had IN×W=1 stored prior to the charge sharing, and $V_{DD}$ is the supply voltage.

Therefore, $V_{RBL}$ represents the sum of IN×W in all memory units 120 sharing the same RBL.

Figure 12:
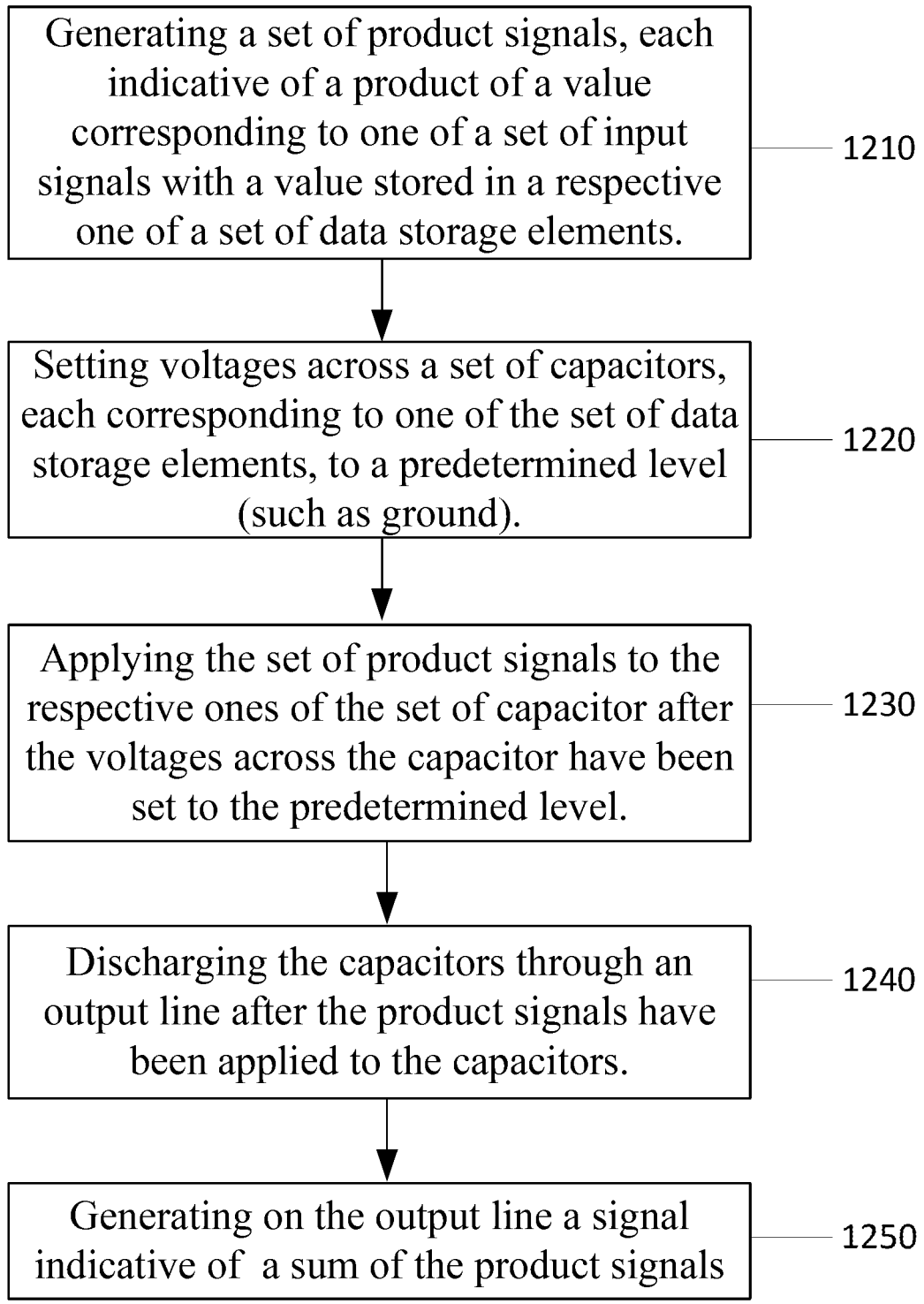
FIG. 12 outlines a process for performing multiplication-accumulation ("MAC") operation in accordance with some embodiments.

More generally, according to some embodiments, a computing method 1200, as outlined in FIG. 12, includes generating 1210 (e.g., by applying input signals to the IN lines, as shown in FIG. 4) a set of product signals, each indicative of a product of a value corresponding to one of a set of input signals with a value stored in a respective one of a set of data storage elements. The method 1200 also includes setting 1220 voltages across a set of capacitors, each corresponding to one of the set of data storage elements, to a predetermined level (such as ground) (e.g., by turning on the second switches 128 while keeping the first switches 124 off, thereby predischarging the capacitors 126, as shown in FIG. 3). The method 1200 further includes applying 1230 (e.g., by turning on the first switches 124 while keeping the second switches 128 off, thereby charging the capacitors 126, as shown in FIG. 4) the set of product signals to the respective ones of the set of capacitor after the voltages across the capacitor have been set to the predetermined level; discharging 1240 (e.g., by turning on the second switches 128 while keeping the first switches 124 off, as shown in FIG. 5) the capacitors through an output line after the product signals have been applied to the capacitors. Finally, the method 1200 includes generating 1250 (e.g., by building up a voltage based on the capacitance, $C_{RBL}$, as shown in FIG. 5) on the output line a signal indicative of a sum of the product signals.

CIM devices discussed in general terms above can be implemented in a variety of configurations. Several examples are shown in FIG. 6-11. The example CIM device 600 is a specific implementation of the CIM device 100 shown in FIG. 1. The memory element 122 is implemented with an SRAM cell 622, which includes two reverse-coupled inverters, each made of a pair of complementary metal oxide semiconductor ("CMOS") transistor. The first inverter is made of a p-type metal-oxide-semiconductor (MOS) field-effect transistor (PMOS) 632 and an n-type MOS field-effect transistor (NMOS) 634 connected in series (i.e., with the source-drain current paths in series) between a high reference voltage (such as $V_{DD}$) and low reference voltage (such as ground); a second inverter is made of a PMOS (636) and an NMOS (638) connected in series between the high reference voltage (such as $V_{DD}$) and low reference voltage (such as ground). The storage element 622 further includes a write access transistors (640), which in this example is an NMOS. The inverters are reverse-coupled, i.e., with the output (i.e., the junction between source/drain current paths) of one coupled to the input (i.e., the gates) of the other. The write access transistor 640 has its source/drain current path connected between the junction of the reverse coupled inverters and the write bitline ("WBL"). The first switch device 124 in FIG. 1 is implemented with a CMOS transmission gate 624, which can be turned on and off by a pair of input lines IN and its complement, INB. The capacitor 626 can be of any suitable type, including metal-insulator-metal ("MIM") and metal-insulator-semiconductor ("MOS") capacitors. The second switch device 128 in FIG. 1 is implemented with another CMOS transmission gate 628, turned on and off by a pair of evaluation lines EVAL and its complement, EVALB.

Figure 6:
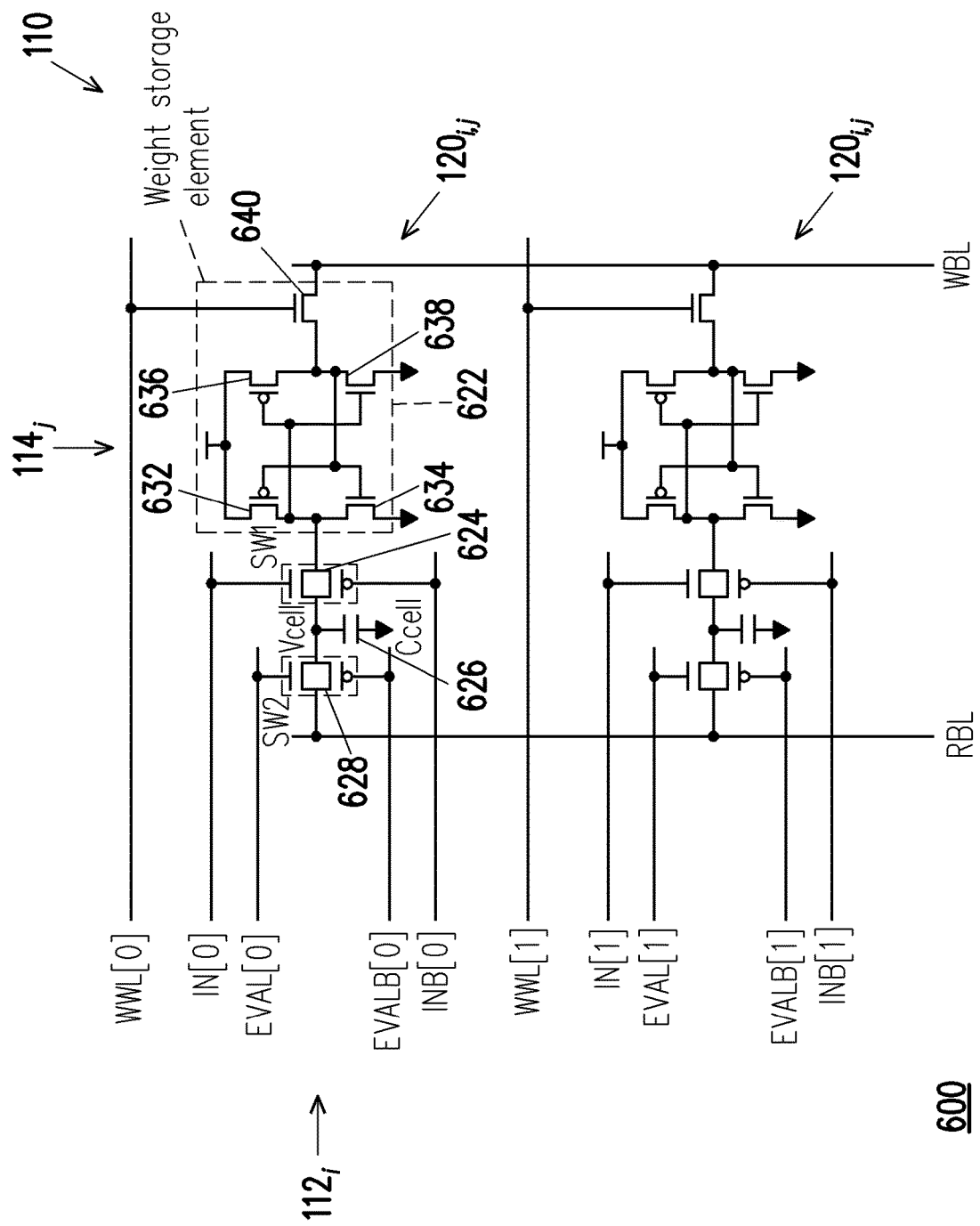
FIG. 6 is a detailed schematic diagram of a portion of a computing-in-memory ("CIM") device in accordance with some embodiments.
Figure 7:
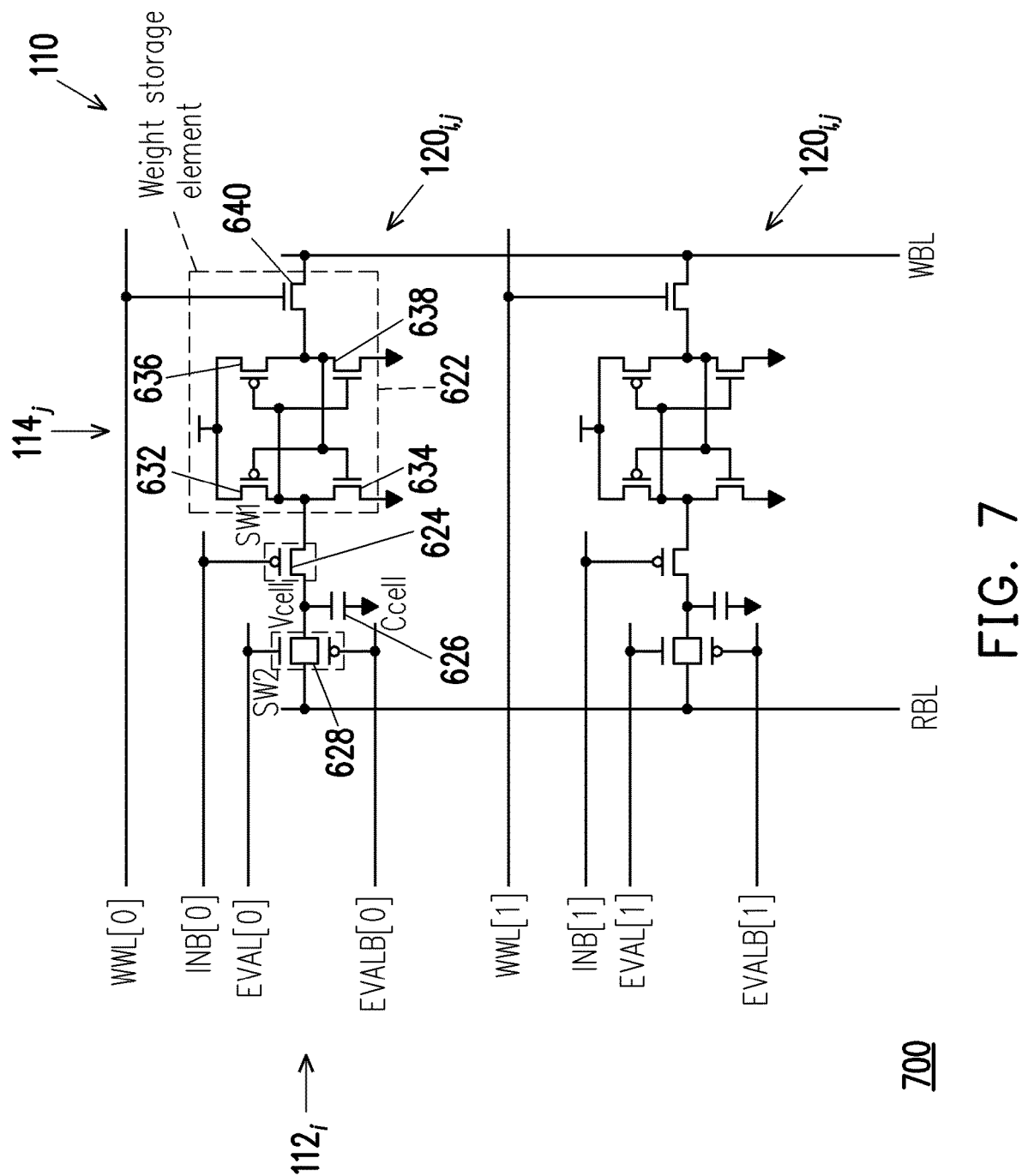
FIG. 7 is a detailed schematic diagram of a portion of a computing-in-memory ("CIM") device in accordance with some embodiments.

In another example implantation, shown in FIG. 7, a CIM device 700 is substantially the same as the CIM device 600 shown in FIG. 6, except that the CMOS transmission gate 624 in the CIM device 600 is replaced by a PMOS 724.

Figure 8:
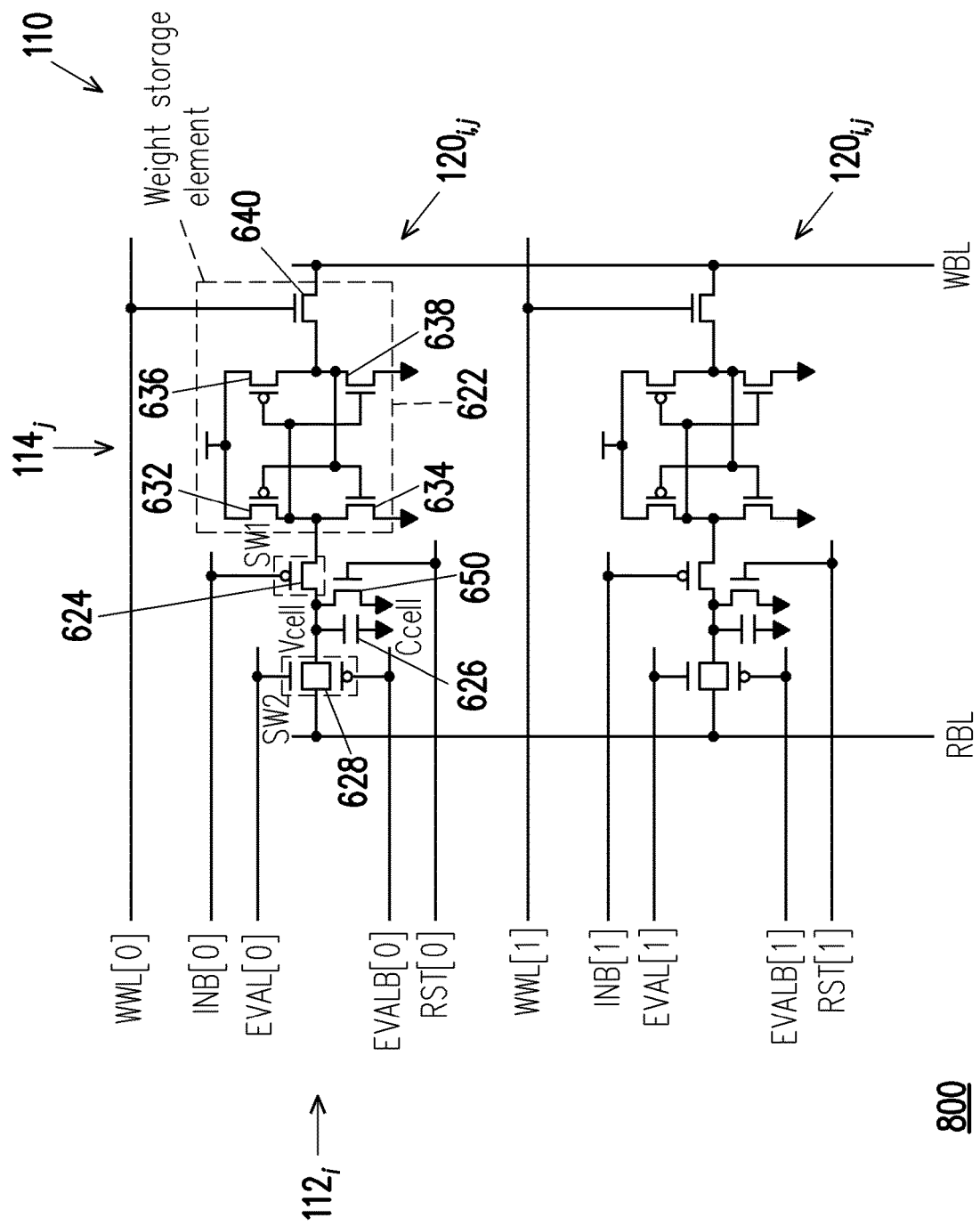
FIG. 8 is a detailed schematic diagram of a portion of a computing-in-memory ("CIM") device in accordance with some embodiments.

In another example implantation, shown in FIG. 8, a CIM device 800 is substantially the same as the CIM device 700 shown in FIG. 7, except that a reset transistor 650 is connected across the capacitor 626 and controlled by a reset line ("RST") to discharge the capacitor 626 instead of using the RSL and second switch device 628 for the discharge. As the signal on RST becomes high, in this particular example, the reset transistor 650 is turned on and conducts, discharging the capacitor 626.

Figure 9:
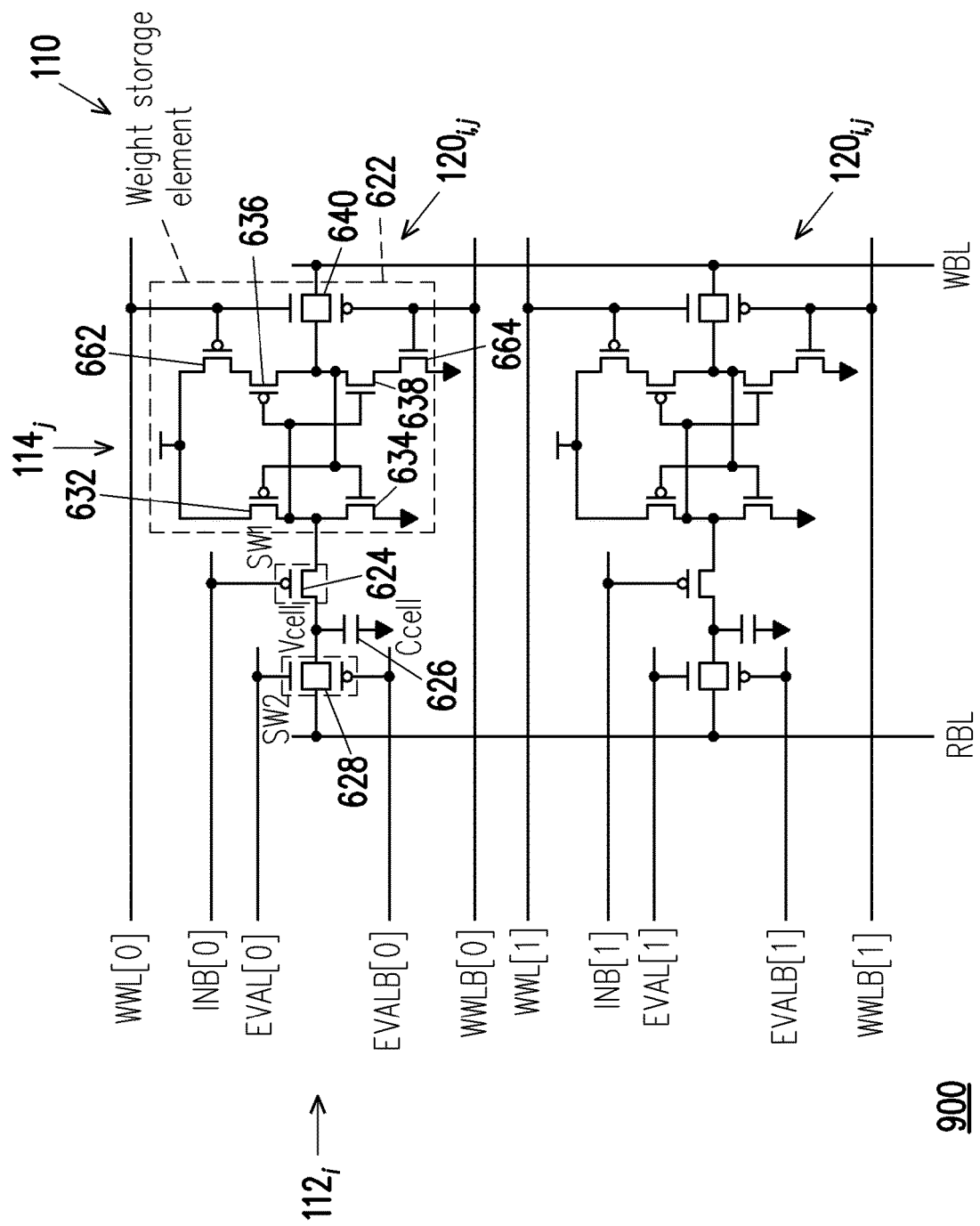
FIG. 9 is a detailed schematic diagram of a portion of a computing-in-memory ("CIM") device in accordance with some embodiments.
Figure 10:
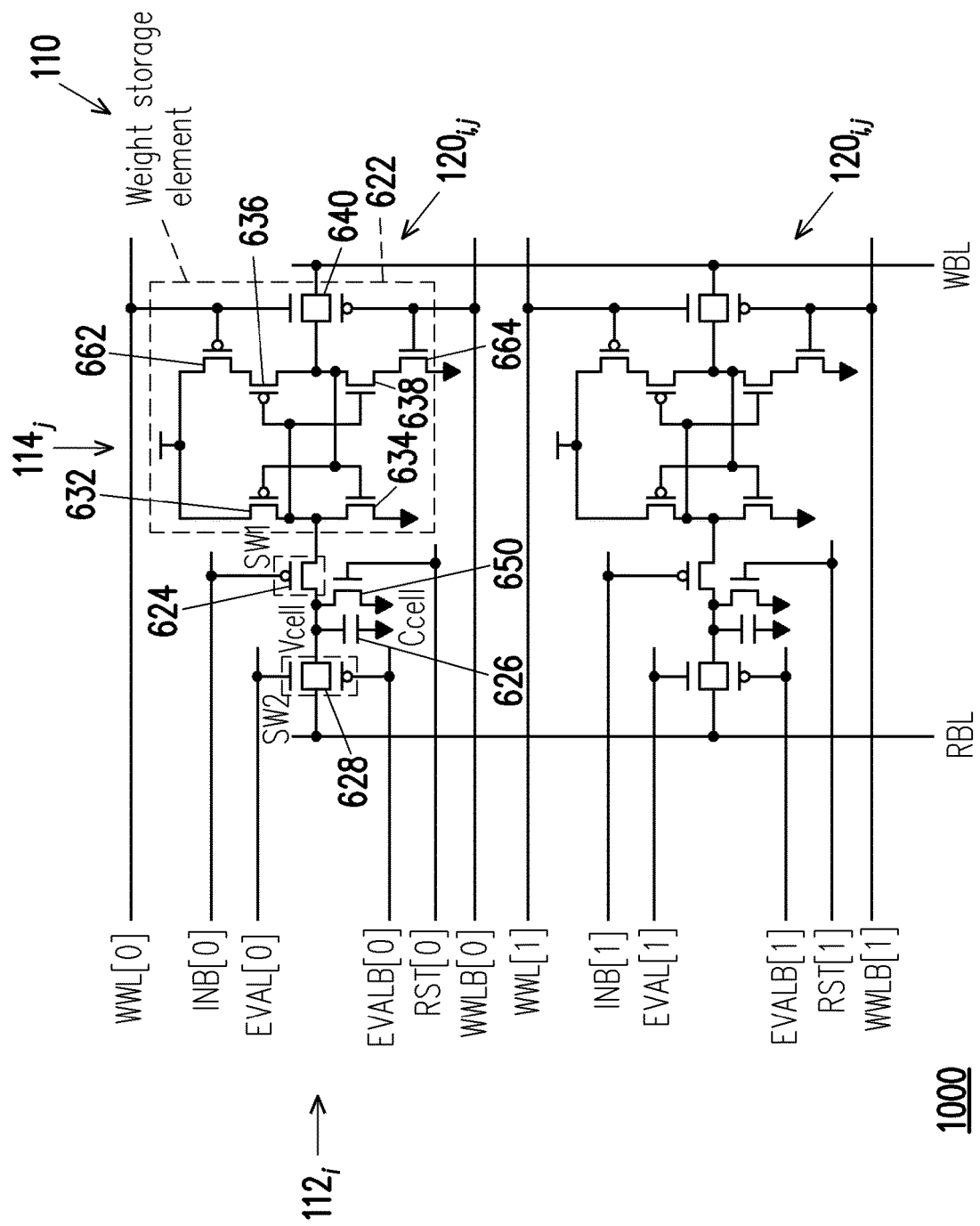
FIG. 10 is a detailed schematic diagram of a portion of a computing-in-memory ("CIM") device in accordance with some embodiments.

In another example implantation, shown in FIG. 9, a CIM device 900 is substantially the same as the CIM device 700 shown in FIG. 7, except that a PMOS 662 and an NMOS 664 are added in series with the CMOS pair 636, 638 (see FIG. 8), and that the NMOS 640 in the CIM device 700 is replaced with a CMOS transmission gate 940. The addition of the PMOS 662 and an NMOS 664 introduces a drain/source voltage drop in series with the CMOS pair 636, 638, thereby increasing the threshold voltage for writing to the SRAM cell and thus enhance the write margin In another example implantation, shown in FIG. 10, a CIM device 1000 is substantially the same as the CIM device 900 shown in FIG. 9, except that a reset transistor 1050 is connected across the capacitor 626 and controlled by a reset line ("RST") to discharge the capacitor 626 instead of using the RSL and second switch device 628 for the discharge, in the same way as in the example shown in FIG. 8.

Figure 11:
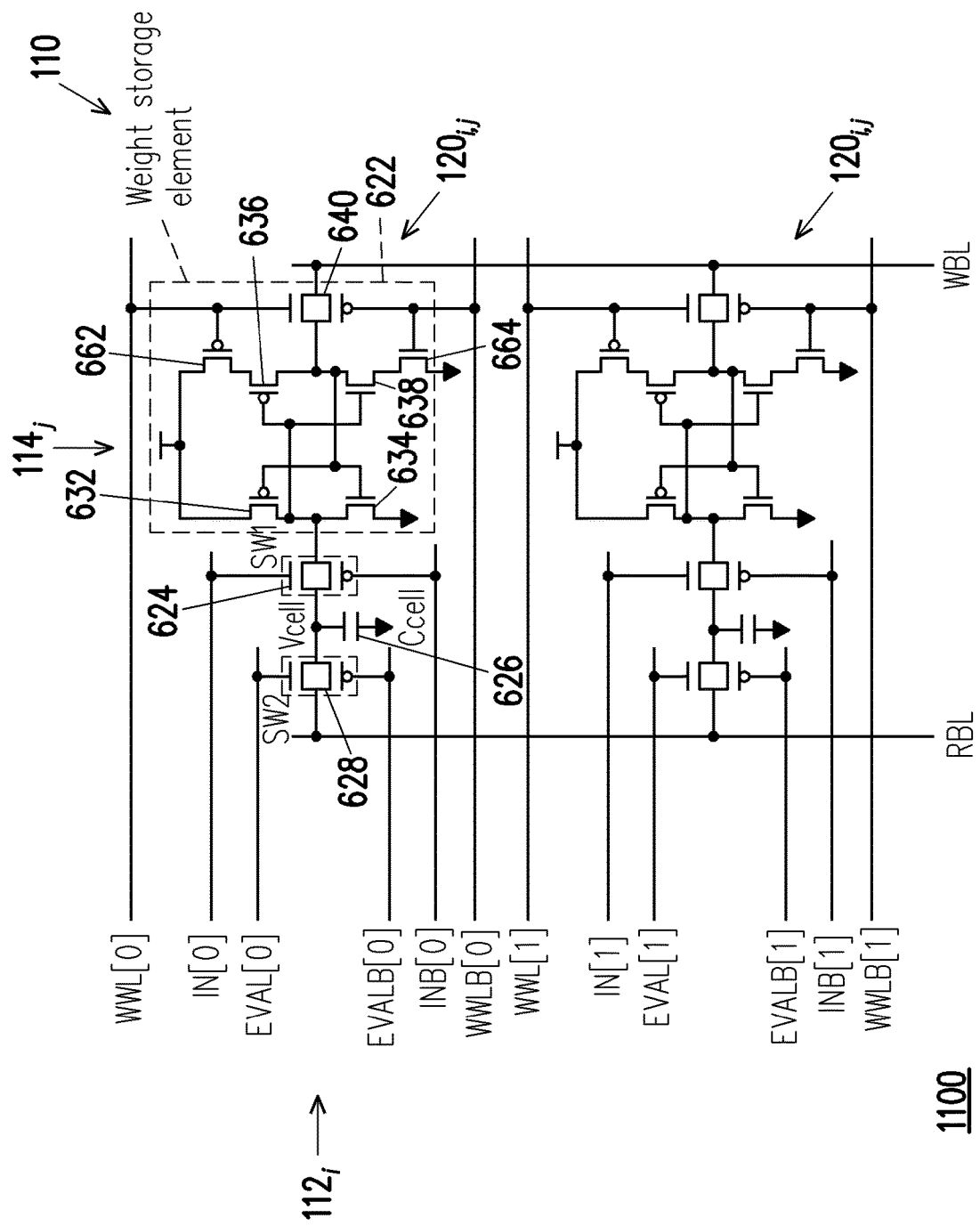
FIG. 11 is a detailed schematic diagram of a portion of a computing-in-memory ("CIM") device in accordance with some embodiments.

In another example implantation, shown in FIG. 11, a CIM device 1100 is substantially the same as the CIM device 900 shown in FIG. 9, except that the CMOS transmission gate 624 in the CIM device 900 is replaced by a PMOS 1124.

Figure 13:
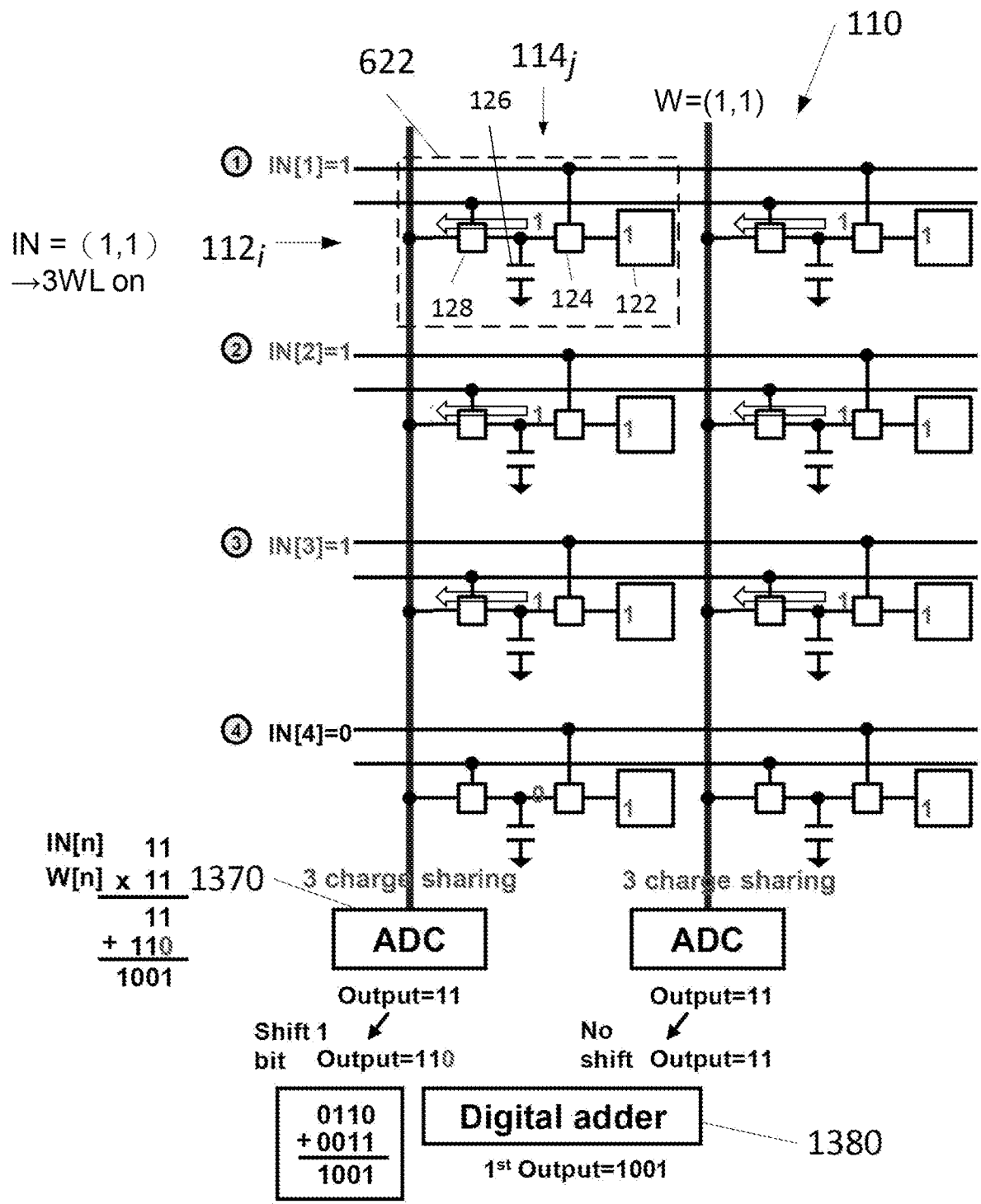
FIG. 13 is a schematic diagram of a CIM device for performing 2-bit multiplication in accordance with some embodiments.

The CIM device described above can be utilized for a variety of applications. For example, as shown in FIG. 13, a device 1300 with a 2×4 array 110 of memory units 622 can be used to perform multiplication of two 2-bit numbers. In some embodiments, because a product n×w is the sum of n s, "1"s are applied to n WLs, or n WLs can be turned on, with w stored in each row. For example, for an IN number of $00_b$, no WL's are turned on; for an IN number $01_b$, one (1) WL is turned on; for an IN number of $10_b$, two (2) WLs are turned on; and for an IN number of $11_b$, three (3) WLs are turned on. A 2-bit W is stored in all four rows 112, with each bit stored in a respective column 114, each column having a respective place value. The RBL voltage, $V_{RBL}$, of each column is fed to a respective analog-to-digital converter ("ADC") 1370 to generate a binary representation of the sum for the column, each column having a respective place value. The output of each ADC 1370 is left shifted, using a shifter (such as a barrel shifter) (not shown), by a number of digits according to the place value of the column: zero bits for the least significant column, one bit for the second least significant column, and so on. Finally, the shifted sums are summed together using a digital adder 1380 to generate the product of the two 2-bit numbers.

As a specific example, to compute the product of n=11b (decimal 3) and w=11 (decimal 3), "11" for w is stored in all four rows, and "1"s are applied to three (3) WLs to represent the value of n. As a result, each bitline produces an RBL voltage, $V_{RBL}$, that is proportional to n (3) times the bit value (in this example, "1" for both bits) for w. The output of the ADC 1370 for each bitline is thus "11." The ADC output for the MSB (left-hand column) is then left-shifted by one (1) bit to generate an shifted output of "110." Finally, the bit-shifted output ("110") of the MSB and un-shifted output ("11") of the LSB are summed together to generate the product of $11_b \times 11_b$: $110_b + 11_b = 1001_b$ (decimal 9).

The example embodiments described above use charge sharing among all memory units, by sharing charges among the capacitors 126 (FIG. 1-5) or 626 (FIGS. 6-11) when the second switches 128, 628 are turned on, in each column to mitigate variations in cell currents due to device variations. The CIM computation accuracy is thus improved over conventional CIM devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
a storage element having a write control input, a weight input and a weight output, and adapted to receive a weight value at the weight input in response to a write control signal from the write control input, and store the weight value;
a capacitor;
a first switch device having a data input and being adapted to interconnect the weight output of the storage element to a first end of the capacitor in response to a data input control signal at the data input;
a second switch device having a read control input and being adapted to interconnect the first end of the capacitor to a read bitline ("RBL") in response to a read control signal at the read control input; and
a third switching device connected across the capacitor and adapted to discharge the capacitor through the switching device.

2. The memory device of claim 1, wherein the storage element includes a static random-access memory ("SRAM") cell.

3. The memory device of claim 2, wherein the second switch device and first switch device are adapted to cooperate to disconnect the first end of the capacitor from the storage element and discharge the capacitor through the RBL in one switching state, and disconnect the first end of the capacitor from the RBL and interconnect the first end of the capacitor with the weight output of the storage element in another switching state.

4. The memory device of claim 1, wherein the storage element comprises a pair of CMOS inverters cross-coupled to each other at a first and second nodes, and wherein the first switch device being adapted to interconnect the first node to a first end of the capacitor in response to a data input control signal at the data input.

5. The memory device of claim 4, wherein one of the pair of CMOS inverters comprises
a first PMOS and a first NMOS connected in a series the second node;
a second PMOS connected in series with the first PMOS; and
a second NMOS connected in series with the first NMOS, the second PMOS and NMOS each having respective gate connected to receive a respective signal to the write control signal.

6. The memory device of claim 1, wherein the first switching device comprises a CMOS transmission gate having a pair of complementary data inputs.

7. The memory device of claim 4, further comprising an access switch device having a write control input and being adapted to interconnect the second node to a write bitline ("WBL") in response to a write control signal at the write control input.

8. The memory device of claim 1, further comprising:
a second storage element having a write control input, a weight input and a weight output, and adapted to receive a weight value at the weight input in response to a second write control signal from the write control input, and store the weight value;
a second capacitor;
a third switch device having a data input and being adapted to interconnect the weight output of the second storage element to a first end of the second capacitor in response to a data input control signal at the data input of the third switch device; and
a fourth switch device having a read control input and being adapted to interconnect the first end of the second capacitor to the RBL in response to a read control signal at the read control input of the fourth switch.

9. A computing device, comprising:
a plurality of read bitlines ("RBLs");
a plurality of write bitlines ("WBLs");
a plurality of write wordlines ("WWLs");
a plurality of input lines ("INs");
a plurality of evaluation lines ("EVALs");
a plurality of memory units logically arranged in rows and columns, each of the columns of the memory units being associated with a respective one of the RBLs and one of the WBLs, each of the row of the memory units being associated with a respective one of the WWLs, one of the INs and one of the EVALs, each of the memory devices comprising:
a storage element having a write control input connected to the WWL associated with row the memory element belongs to, a weight input connected to the WBL associated with column the memory unit belongs to and a weight output, and adapted to receive a weight value from the WBL in response to a write control signal from the WWL, and store the weight value;
a capacitor;
a first switch device having a data input connected to the IN associated with row the memory unit belongs to and being adapted to interconnect the weight output of the storage element to a first end of the capacitor in response to a data input control signal from the IN;
a second switch device having a read control input connected to the EVAL associated with row the memory unit belongs to and being adapted to interconnect the first end of the capacitor to the RBL associated with row the memory unit belongs to in response to a read control signal from the EVAL; and
a third switching device connected across the capacitor and adapted to discharge the capacitor through the switching device.

10. The computing device of claim 9, wherein the first switching devices and the second switch devices of the memory units in each column are adapted to disconnect the first ends of the capacitors from the respective storage elements and connect the capacitors in the column parallel between and a reference voltage.

11. The computing device of claim 10, further comprising a plurality of ADCs, each connected to a respective one of the RBLs and adapted to receive an analog signal from the RBL and generate a digital output indicative of a value of the analog signal.

12. The computing device of the claim 11, further comprising a plurality of digital shifters, each adapted to receive the digital output from a respective one of the ADCs and shift the digital output by a predetermined number of digits, the predetermined number digits being different for each column.

* * * * *